United States Patent
Chang (10) Patent No.: US 12,125,802 B2
(45) Date of Patent: Oct. 22, 2024

(54) CHIP AND MEMORY

(71) Applicant: CHANGXIN MEMORY TECHNOLOGIES, INC., Hefei (CN)

(72) Inventor: Chih-Wei Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 603 days.

(21) Appl. No.: 17/386,655

(22) Filed: Jul. 28, 2021

(65) Prior Publication Data

US 2022/0077079 A1 Mar. 10, 2022

Related U.S. Application Data

(63) Continuation of application No. PCT/CN2021/098839, filed on Jun. 8, 2021.

(30) Foreign Application Priority Data

Sep. 9, 2020 (CN) .......................... 202010950123.7

(51) Int. Cl.
*H01L 23/00* (2006.01)
*H01L 21/764* (2006.01)
(Continued)

(52) U.S. Cl.
CPC .......... *H01L 23/562* (2013.01); *H01L 21/764* (2013.01); *H01L 23/481* (2013.01);
(Continued)

(58) Field of Classification Search
None
See application file for complete search history.

(56) References Cited

U.S. PATENT DOCUMENTS

| 8,647,920 B2 | 2/2014 | Sabuncuoglu Tezcan |
| 2012/0013022 A1* | 1/2012 | Sabuncuoglu Tezcan ................. H01L 23/481 |
| | | 257/774 |

(Continued)

FOREIGN PATENT DOCUMENTS

| CN | 103021935 A | 4/2013 |
| CN | 104078414 A | 10/2014 |

(Continued)

OTHER PUBLICATIONS

Supplementary European Search Report in the European application No. 21769871.1, mailed on Jun. 9, 2022, 8 pgs.

(Continued)

*Primary Examiner* — Michelle Mandala
(74) *Attorney, Agent, or Firm* — Kilpatrick Townsend & Stockton LLP (57) ABSTRACT

Provided are a chip and a memory, relating to the technical field of semiconductors, and intended to solve the technical problem of low qualification rate of chips. The chip includes a base in which a through hole penetrating through the base is provided. A conductive column is provided in the through hole. A first surface of the base is provided with a first annular groove which surrounds the conductive column. A first isolator is provided in the first annular groove, and a first air gap extending along a circumferential direction of the first annular groove is formed in the first isolator.

14 Claims, 4 Drawing Sheets

(51) Int. Cl.
    *H01L 23/48*     (2006.01)
    *H01L 25/065*     (2023.01)
    *H01L 29/06*     (2006.01)

(52) U.S. Cl.
    CPC ...... *H01L 25/0657* (2013.01); *H01L 29/0649* (2013.01); *H01L 2225/06541* (2013.01)

(56) References Cited

U.S. PATENT DOCUMENTS

| | | |
|---|---|---|
| 2012/0292746 A1 | 11/2012 | Lee |
| 2013/0140680 A1 | 6/2013 | Harada et al. |
| 2017/0141207 A1* | 5/2017 | Cheng ................. H01L 23/5329 |
| 2019/0088599 A1* | 3/2019 | Seto .................... H01L 23/5226 |

FOREIGN PATENT DOCUMENTS

| | | |
|---|---|---|
| CN | 104253082 A | 12/2014 |
| CN | 103367318 B | 7/2016 |
| EP | 2408006 A2 | 1/2012 |
| KR | 101062848 B1 | 9/2011 |

OTHER PUBLICATIONS

International Search Report in the international application No. PCT/CN2021/098839, mailed on Sep. 8, 2021, 2 pgs.

* cited by examiner

CHIP AND MEMORY

CROSS-REFERENCE TO RELATED APPLICATION

The present application is a continuation of International Patent Application No. PCT/CN2021/098839, filed on Jun. 8, 2021, which is based on and claims priority to Chinese Patent Application No. 202010950123.7, filed to the China Patent Office on Sep. 9, 2020 and entitled "Chip and Memory". The disclosures of International Patent Application No. PCT/CN2021/098839 and Chinese Patent Application No. 202010950123.7 are hereby incorporated by reference in their entireties.

BACKGROUND

With the continuous development of a semiconductor manufacturing technology and a three-dimensional packaging technology, electronic products tend to be miniaturized and highly integrated, the packaging size of chips is continuously reduced, and a stacked chip packaging technology has emerged. The stacked chip packaging technology, also known as a three-dimensional packaging technology, refers to a packaging technology in which more than two chips are stacked in a vertical direction within the same package. For example, in a Dynamic Random Access Memory (DRAM), a plurality of chips are vertically stacked and communicated with each other through the three-dimensional packaging technology to improve the storage capacity and bandwidth of the DRAM.

In the three-dimensional packaging technology, a Through Silicon Via (TSV) technology is used for manufacturing corresponding through holes on silicon wafers of all chips, conductive materials are filled in the through holes to realize vertical conduction between stacked chips, the interconnection distance is shortened, and the interconnection delay is reduced. Meanwhile, the operation efficiency of devices on the chips can be improved, the power consumption can be reduced, and therefore the TSV technology can be widely applied. A structure formed by using the TSV technology is commonly referred to as a TSV structure in which copper is typically used as conductive materials filled in through holes. The Coefficient of Thermal Expansion (CTE) of copper is $17.8 \times 10^{-6}$/K, and the CTE of silicon is $2.5 \times 10^{-6}$/K, so that a problem of CTE mismatch is caused between copper and silicon wafers in the TSV structure. When the TSV structure serving as a signal channel self-heats or when heat from an environmental heat source is increased, a thermal stress is generated between the TSV structure and the silicon wafer. Lattices of the silicon wafer near the TSV structure are deformed, the electron mobility of the silicon wafer is changed, local delamination of chips is caused, electrical elements on chips are easy to fail, and the qualification rate of chips is affected.

SUMMARY

The present disclosure relates to the technical field of semiconductors, and in particular to a chip and a memory.

To achieve the above object, the present disclosure provides the following technical solutions.

In a first aspect, the present disclosure provides a chip, which may include a base. A through hole penetrating through the base may be provided in the base. A conductive column may be provided in the through hole. A first surface of the base may be provided with a first annular groove that may surround the conductive column. A first isolator in which a first air gap extending along a circumferential direction of the first annular groove may be formed may be provided in the first annular groove.

In a second aspect, the present disclosure also provides a memory, which may include at least two stacked chips as described above. Conductive columns in the adjacent chips may abut.

DETAILED DESCRIPTION

The embodiments of the present disclosure provide a chip. The chip is provided with a TSV hole, a shallow trench is provided around the TSV hole for isolation, an isolation material is filled in the shallow trench, an air gap extending along a circumferential direction of the shallow trench is formed in the isolation material, so that the isolation material may isolate an electrical element while the air gap plays a role of releasing a stress, the influence of thermal expansion of the TSV hole on the electrical element outside the shallow trench is reduced, the failure of the electrical element is further reduced, and the qualification rate of the chip is improved.

In order that the above objects, features, and advantages of the embodiments of the present disclosure may be more readily understood, the technical solutions in the embodiments of the present disclosure will be clearly and completely described below with reference to the drawings in the embodiments of the present disclosure. It is apparent that the described embodiments are only a part of the embodiments of the present disclosure, not all of the embodiments. Based on the embodiments in the present disclosure, all other embodiments obtained by those of ordinary skill in the art without involving any inventive effort are within the scope of protection of the present disclosure.

A memory may store a data set temporarily or permanently. A DRAM relies on a capacitor to store charge to register information, and is a temporary data storage medium commonly used as a memory. The DRAM typically includes a substrate, at least two chips stacked on the substrate, and a TSV structure electrically connecting chips. Specifically, each chip in the DRAM is provided with a through hole, and a conductive column is filled in the through hole to form a TSV hole. When the chips are stacked, the TSV holes of the chips correspond to each other, so that the conductive columns are contacted and conducted to form a TSV structure, the chips can be electrically connected and vertically connected, the signal transmission time is shortened, and the manufacturing cost is reduced.

A plurality of TSV holes may be manufactured by each chip. The chips close to the substrate may be connected to the substrate through solder balls, and the TSV holes of two adjacent chips may also be connected through solder balls. Certainly, the chips close to the substrate and the substrate and the TSV holes of two adjacent chips may also be connected through a conductive adhesive, paste, or alloy.

A chip typically refers to a semiconductor element carrying an integrated circuit and is formed by the steps of wafer manufacturing, circuit design, package testing, etc. Specifically, a semiconductor is manufactured into a wafer through processes of crystal pulling, slicing, etc., the wafer is formed into a circuit structure through a semiconductor manufacturing process, and the chip is formed through processes of cutting, packaging, etc.

Since the material of the wafer is typically silicon, the present embodiment and the following embodiments are described in detail by taking a silicon wafer as an example. A memory in the embodiments of the present disclosure includes at least two chips which are described in the following embodiments and are stacked on a substrate, so that the memory has the advantages of the chips.

Figure 1:
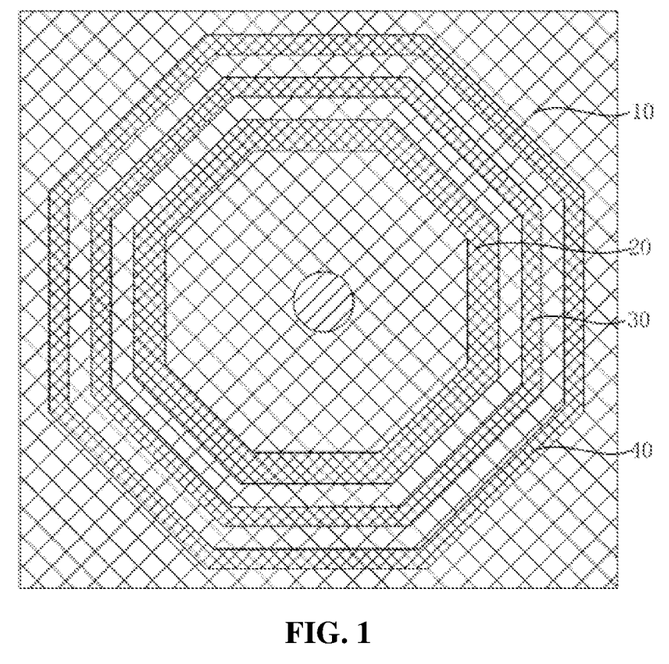
FIG. 1 is a structure diagram of a chip according to an embodiment of the present disclosure.
Figure 2:
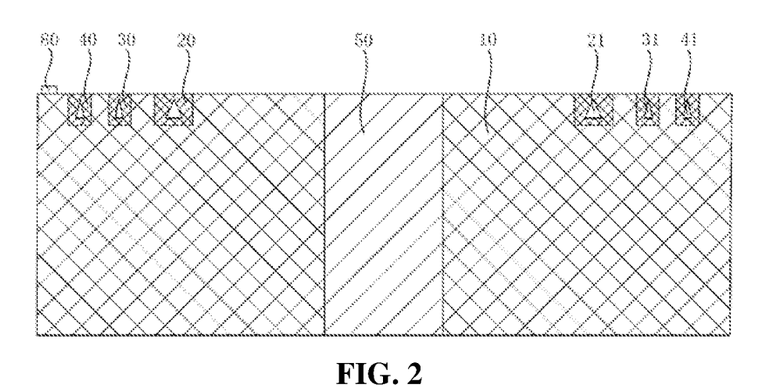
FIG. 2 is a cross-sectional view of a chip according to an embodiment of the present disclosure.

Referring to FIGS. 1 and 2, the chip includes a base 10. In the embodiments of the present disclosure, the base 10 may be a silicon wafer, the base 10 is formed with a through hole 14 penetrating through the base, a conductive column 50 is provided in the through hole 14, and the through hole 14 filled with the conductive column 50 is a TSV hole. TSV holes in two or more chips are contacted to form a TSV structure, and a vertical electrical connection between the chips is realized.

The through hole 14 may be formed by wet etching, laser machining, dry etching, photo-assisted electrochemical etching, etc. For example, in the embodiments of the present disclosure, a required through hole 14 is formed by Deep Reactive Ion Etching (DRIE), the through hole 14 is formed by DRIE, an inner wall of the through hole 14 is smooth, and mechanical and physical damages of the base 10 are small.

The formation of the through hole 14 may be at different stages. For example, the manufacturing of the through hole 14 after a Back End of Line (BEOL) may not change the design flow of an existing chip.

A plane parallel to a first surface of the base 10 serves as a cross section. As shown in FIG. 2, the first surface of the base 10 is an upper surface of the base 10. The cross section of the through hole 14 is typically in the shape of a circle to facilitate the manufacturing of the through hole 14 and the arrangement of the conductive column 50. The through hole 14 may be a straight through hole or an inclined through hole. The inclined through hole refers to that a plane perpendicular to the first surface of the base 10 and including a center line of the through hole 14 serves as a cross section, and the cross section of the through hole 14 is in the shape of an inverted trapezoid.

The material of the conductive column 50 may be metal. For example, the material of the conductive column 50 may be tungsten, copper, etc., so as to achieve electrical signal interconnection between a plurality of stacked chips. In the embodiments of the present disclosure, the material of the conductive column 50 is copper. For example, a copper plating process is used to form a copper column in the through hole 14.

It will be appreciated that an insulating layer and a barrier layer are also provided between the through hole 14 and the conductive column 50. The insulating layer is close to an inner wall of the through hole 14 relative to the barrier layer. The insulating layer is configured to electrically isolate the conductive column 50 and the base 10. The material of the insulating layer may be an insulating material such as silicon oxide or silicon nitride. The barrier layer is configured to prevent metal from diffusing into the base 10 and improve metal adhesion so as to improve the process stability. The material of the barrier layer may be titanium, titanium nitride, tantalum, chromium, chromium nitride, etc.

With continued reference to FIGS. 1 and 2, the first surface of the base 10 is provided with a first annular groove 11. As shown in FIG. 2, the upper surface of the base 10 is provided with a first annular groove 11. The first annular groove 11 surrounds the conductive column 50. The first surface of the base 10 may also be provided with an electrical element 80. The electrical element 80 is configured to form an integrated circuit. The electrical element 80 includes a Metal Oxide Semiconductor (MOS) field effect transistor, a diode, a resistor, a capacitor, etc.

Specifically, the first annular groove 11 forms a closed pattern around the conductive column 50. The conductive column 50 is located inside the closed pattern. The electrical element is located outside the closed pattern, i.e. on a side of the first annular groove 11 away from a center line thereof. The first annular groove 11 is provided with a first isolator 20. The first isolator 20 is made of an insulating material, such as silicon oxide, so that the electrical element 80 is electrically isolated from the conductive column 50 to ensure that the electrical element may work normally.

Specifically, the first annular groove 11 has a depth of 0.2 μm to 2 μm in a direction of the center line of the through hole 14. The first annular groove 11 may be formed by a Shallow Trench Isolation (STI) process, mainly by the steps of trench etching, oxide filling, and oxide planarization.

A plane perpendicular to the center line of the through hole 14 serves as a cross section, and the cross section of the first annular groove 11 is in the shape of a regular polygon with eight or more sides. For example, referring to FIG. 1, the cross section of the first annular groove 11 is in the shape of a regular octagon. By means of the arrangement, on one hand, the problems that corners among all sides of the regular polygon are too sharp and stress is concentrated can be solved, on the other hand, the area of a Keep Out Zone (KOZ) can be reduced, and electrical layout cannot be carried out in the zone.

It is to be noted that when the cross section of the first annular groove 11 is in the shape of a regular polygon with eight or more sides, the regular polygon has an inscribed circle diameter of 5 μm to 40 μm. In the embodiments of the present disclosure, the inscribed circle diameter of a side of the first annular groove 11 close to the conductive column is any value of 5 μm to 40 μm.

In another possible example, a plane perpendicular to the center line of the through hole 14 serves as a cross section, and the cross section of the first annular groove 11 is in the shape of a circle. The area of the KOZ is further reduced, so that the space on the first surface of the base 10 can be fully utilized.

With continued reference to FIGS. 1 and 2, the center line of the first annular groove 11 may coincide with the center line of the conductive column 50, i.e., the center line of the first annular groove 11 coincides with the center line of the through hole 14. By means of the arrangement, the distance of each side of the first annular groove 11 from the center line of the conductive column 50 is approximately equal, so that the thermal stress at each side of the first annular groove 11 is approximately equal, thereby reducing the failure of the first annular groove 11 and the first isolator 20 located in the first annular groove 11 and even the failure of the electrical element 80 caused by excessive thermal stress at a position in the first annular groove 11.

The first annular groove 11 is filled with a first isolator 20, and an upper surface of the first isolator 20 may be flush with the upper surface of the base 10. A first air gap 21 extending along a circumferential direction of the first annular groove 11 is formed in the first isolator 20, i.e. the first air gap 21 also surrounds the conductive column 50 for one circle. The first air gap 21 may buffer the thermal stress to reduce the influence of the thermal stress on the electrical element so that the electrical element 80 may work normally.

The working principle of the first air gap 21 is described in detail by taking the conductive column 50 made of copper, the first isolator 20 made of silicon dioxide, and the base 10 made of silicon as examples.

Since the CTE of copper is greater than that of silicon, when current flows through the conductive column 50 to cause the conductive column 50 to generate heat, or heat from an environmental heat source is increased, the conductive column 50 expands in volume, a thermal stress is caused between the conductive column and the base 10, and silicon lattices in a zone of the base 10 close to the conductive column 50 are squeezed and deformed. When the thermal stress is transferred to the first isolator 20, the first air gap 21 in the first isolator 20 serves to release the thermal stress due to the compressibility of air, so that the silicon lattices in a zone of the base 10 outside the first annular groove 11 is less deformed or not deformed, and the electrical element 80 located on the zone may work normally. That is, the influence of the thermal stress on the zone outside the first annular groove 11 can be alleviated or avoided by the first air gap 21.

It is to be noted that a plane perpendicular to the surface of the base 10 and including the center line of the through hole 14 serves as a cross section, and the cross section of the first air gap 21 may be in the shape of a triangle, a rectangle, a circle, or an ellipse. The shape of the cross section of the first air gap 21 is not limited herein.

Specifically, the first isolator 20 may be deposited in the first annular groove 11 by Chemical Vapor Deposition (CVD) or Physical Vapor Deposition (PVD), and the first air gap 21 may be formed in the first isolator 20 by controlling a deposition rate. For example, when the deposition rate is high, the first annular groove 11 is easily sealed, i.e. the first air gap 21 is easily formed in the first isolator 20.

It is to be noted that the first surface of the base 10 may also be provided with a second annular groove 12 and/or a third annular groove 13. A multi-stage isolation structure may be adopted to further ensure electrical isolation between the conductive column 50 and the electrical element, thereby ensuring that the electrical element may work normally.

The depths of the first annular groove 11, the second annular groove 12, and the third annular groove 13 may be uniform in the direction of the center line of the through hole 14, so that the first annular groove 11, the second annular groove 12, and the third annular groove 13 may be formed by one patterning process, thereby simplifying the manufacturing steps of the chip.

In one possible example, the first surface of the base 10 is provided with a two-stage isolation structure. For example, the first surface of the base 10 is provided with a second annular groove 12. The second annular groove 12 surrounds the first annular groove 11. The center line of the first annular groove 11, the center line of the second annular groove 12, and the center line of the conductive column 50 coincide, a plane parallel to the first surface of the base 10 serves as a cross section, and the cross sections of the first annular groove 11 and the second annular groove 12 are matched in shape.

For example, the cross sections of the first annular groove 11 and the second annular groove 12 are both in the shape of a regular octagon, and corresponding sides in the first annular groove 11 and the second annular groove 12 are parallel to each other. The width of the first annular groove 11 is greater than that of the second annular groove 12 along a radial direction of the through hole 14 due to a large thermal stress in the zone close to the conductive column 50.

It is to be noted that the second annular groove 12 is provided with a second isolator 30. The material of the second isolator 30 is consistent with that of the first isolator 20, and the conductive column 50 and the electrical element are further electrically isolated. A second air gap 31 extending along a circumferential direction of the second annular groove 12 is formed in the second isolator 30 to further release the thermal stress while improving the effect of electrical isolation. The second annular groove 12, the second isolator 30, and the second air gap 31 may be provided with reference to the first annular groove 11, the first isolator 20, and the first air gap 21. Detailed descriptions are omitted herein.

In another possible example, the first surface of the base 10 is provided with a three-stage isolation structure. As shown in FIGS. 1 and 2, the first surface of the base 10 is further provided with a second annular groove 12 and a third annular groove 13. The second annular groove 12 is sleeved outside the first annular groove 11. A second isolator 30 is filled in the second annular groove 12. The third annular groove 13 is sleeved outside the second annular groove 12. A third isolator 40 is filled in the third annular groove 13. Both the second isolator 30 and the third isolator 40 are made of insulating materials.

The center line of the first annular groove 11, the center line of the second annular groove 12, the center line of the third annular groove 13, and the center line of the conductive column 50 coincide. Referring to FIG. 1, a plane parallel to the first surface of the base 10 serves as a cross section, and the cross sections of the first annular groove 11, the second annular groove 12, and the third annular groove 13 are matched in shape, e.g. in the shape of a regular octagon, and corresponding sides in the first annular groove 11, the second annular groove 12, and the third annular groove 13 are parallel to each other.

The width of the first annular groove 11 is greater than that of the second annular groove 12 and that of the third annular groove 13 along a radial direction of the through hole 14, and the second annular groove 12 and the third annular groove 13 may be consistent in width. The first annular groove 11, the second annular groove 12, and the third annular groove 13 may be arranged at equal distances, and the distance between the first annular groove 11 and the second annular groove 12 may also be greater than the distance between the second annular groove 12 and the third annular groove 13.

It is to be noted that a second air gap 31 extending along a circumferential direction of the second annular groove 12 may be formed in only the second isolator 30; a third air gap 41 extending along a circumferential direction of the third annular groove 13 may be formed in only the third isolator 40; or, a second air gap 31 extending along a circumferential direction of the second annular groove 12 is formed in the second isolator 30, and a third air gap 41 extending along a circumferential direction of the third annular groove 13 is formed in the third isolator 40.

Referring to FIG. 2, in the embodiments of the present disclosure, a second air gap 31 is formed in the second isolator 30, and a third air gap 41 is formed in the third isolator 40. By means of the arrangement, the first isolator 20, the second isolator 30, and the third isolator 40 may be formed simultaneously, thereby reducing the processing steps. Additionally, the first air gap 21, the second air gap 31, and the third air gap 41 may act to relieve stress step by step, and the thermal stress has little influence on the electrical element 80.

Figure 3:
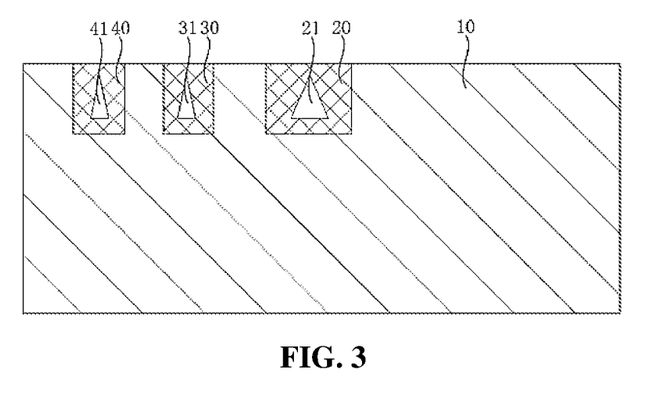
FIG. 3 is a partial structure diagram of a chip according to an embodiment of the present disclosure.
Figure 4:
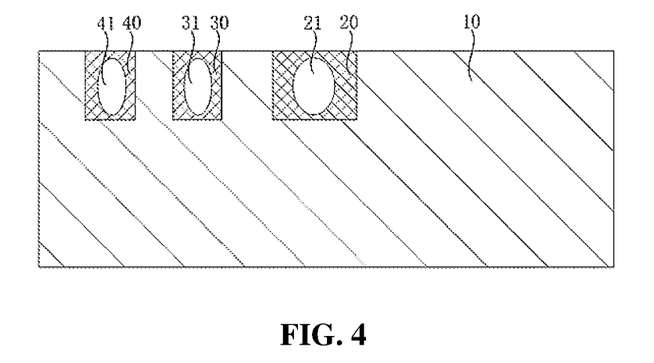
FIG. 4 is another partial structure diagram of a chip according to an embodiment of the present disclosure.

It is to be noted that a plane perpendicular to the surface of the base 10 and including the center line of the through hole 14 serves as a cross section, and the cross sections of the first air gap 21, the second air gap 31, and the third air gap 41 may be all in the shape of a triangle as shown in FIG. 3, or an ellipse as shown in FIG. 4.

The second annular groove 12, the second isolator 30, the second air gap 31, the third annular groove 13, the third isolator 40, and the third air gap 41 may be provided with reference to the first annular groove 11, the first isolator 20, and the first air gap 21. Detailed descriptions are omitted herein.

Hereinafter, for example, a chip has three annular grooves and three air gaps, and the manufacturing process and principle of the chip will be described in detail with reference to FIGS. 5 to 8.

Figure 8:
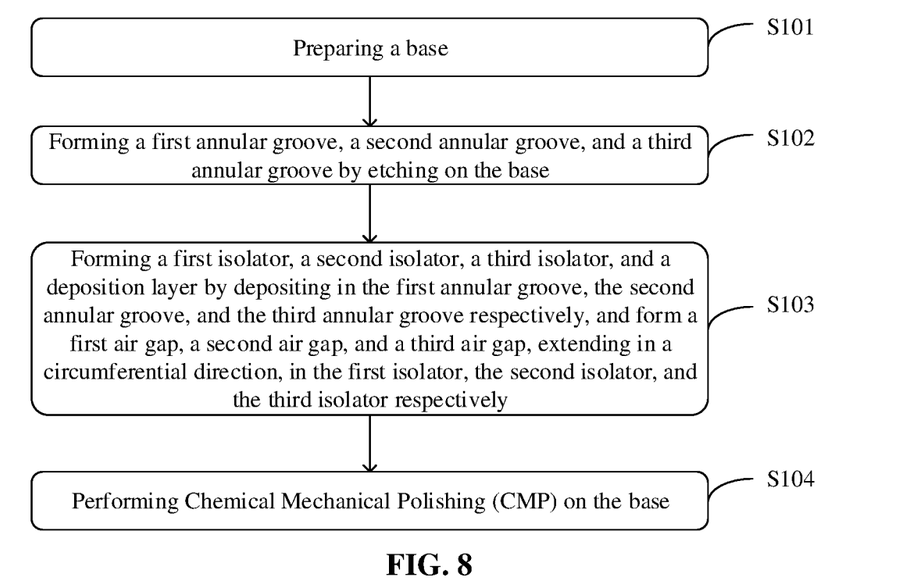
FIG. 8 is a manufacturing flowchart of a chip according to an embodiment of the present disclosure.

In S101, a base is prepared.

In the embodiments of the present disclosure, the material of the base 10 is a silicon material, i.e. the base 10 is a silicon base. The base 10 includes an active zone for providing an electrical element 80.

The base 10 may be provided with a through hole 14. The active zone is spaced apart from the through hole 14. A conductive column 50 is provided in the through hole 14. The base 10 may not be provided with the through hole 14, and the through hole 14 may be provided after the base 10 forms each annular groove and each air gap.

In S102, a first annular groove, a second annular groove, and a third annular groove are formed by etching on the base.

Figure 5:
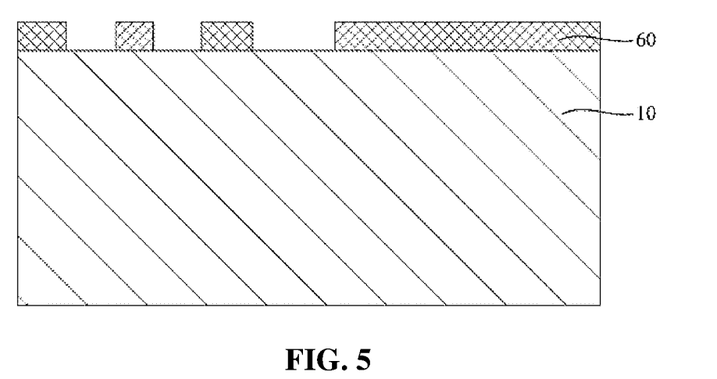
FIG. 5 is a diagram of a mask according to an embodiment of the present disclosure.
Figure 6:
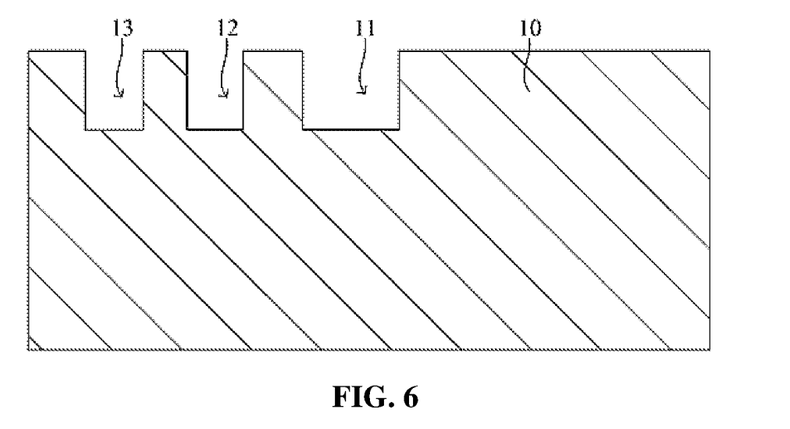
FIG. 6 is a diagram of etching according to an embodiment of the present disclosure.

In the embodiments of the present disclosure, each of the above-described annular grooves may be formed by a patterning process. Specifically, a photoresist layer 60 is spin-coated on an upper surface of the base 10. Then the photoresist layer 60 is exposed and developed by a mask having the above-described annular groove pattern. As shown in FIG. 5, a patterned photoresist layer 60 is obtained. Then the base 10 is etched by taking the photoresist layer 60 as a mask. As shown in FIG. 6, the above-described annular grooves are formed. Finally, the remaining photoresist layer 60 is removed to obtain a first annular groove 11, a second annular groove 12, and a third annular groove 13. The first annular groove 11, the second annular groove 12, and the third annular groove 13 isolate an active zone. That is, the active zone is located on a side of each annular groove away from a center line of each annular groove so as to facilitate subsequent electrical isolation of the electrical element 80 and the conductive column 50.

In S103, a first isolator, a second isolator, a third isolator, and a deposition layer are formed by depositing in the first annular groove, the second annular groove, and the third annular groove respectively. A first air gap, a second air gap, and a third air gap, extending in a circumferential direction, are formed in the first isolator, the second isolator, and the third isolator respectively.

Figure 7:
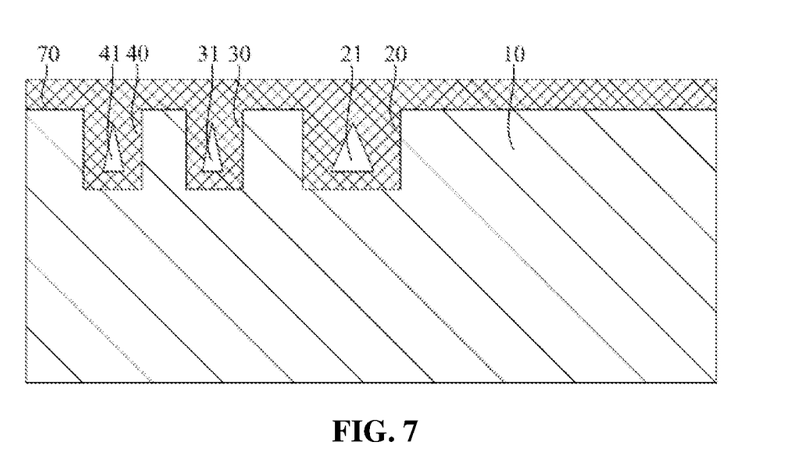
FIG. 7 is a diagram of deposition according to an embodiment of the present disclosure.

In the embodiments of the present disclosure, the deposition may be CVD or PVD, the deposition may be performed at a lower temperature, e.g. at a temperature of 300-400° C., and each air gap is formed by controlling the deposition rate.

It is to be noted that in addition to forming each isolator and each air gap during the deposition process, a deposition layer 70 is also formed on the upper surface of the base 10. The deposition layer 70 is used for subsequent polishing. As shown in FIG. 7, the first annular groove 11, the second annular groove 12, the third annular groove 13, and the deposition layer 70 are of an integrated structure.

In S104, Chemical Mechanical Polishing (CMP) is performed on the base.

The CMP is used to planarize the base 10. Specifically, components such as a catalyst, a surfactant, a flow improver, and a stabilizer in a polishing solution are chemically reacted with the deposition layer 70 to soften the surface of the deposition layer 70, and then the softened layer is removed by a physical mechanical method to expose a new surface of the deposition layer 70. The two steps are cyclically alternated to finally achieve polishing. That is, a smooth upper surface of the base 10 is formed by removing the deposition layer 70 on the base 10 by mechanical cutting through abrasive particles and corrosion through chemical agents.

It is to be noted that the above-described steps are part of a chip manufacturing process for forming annular grooves and air gaps, the remaining manufacturing processes may be referred to in the prior art, and the detailed descriptions thereof are omitted herein.

In the chip provided by the embodiments of the present disclosure, a base 10 is provided with a through hole 14 penetrating through the base 10, a conductive column 50 is provided in the through hole 14, and the through hole 14 filled with the conductive column 50 forms a TSV hole for an electrical signal connection of the chip with other components. A first surface of the base 10 is provided with an electrical element and a first annular groove 11. The first annular groove 11 surrounds the conductive column 50. The electrical element and the conductive column 50 are electrically isolated by the first annular groove 11. A first isolator 20 is provided in the first annular groove 11. A first air gap 21 extending along a circumferential direction of the first annular groove 11 is formed in the first isolator 20. When generated between the conductive column 50 and the base 10, a thermal stress is released by the first air gap 21 in the first isolator 20, thereby alleviating or avoiding lattice deformation in the base 10 outside the first annular groove 11, relieving local delamination of the chip, alleviating influence of the thermal stress on electrical elements on the chip, reducing failure of the electrical elements, and further improving the qualification rate of the chip.

The embodiments or implementations described in this specification are described in an incremental manner, with each embodiment being described with emphasis on differences from the other embodiments, and with reference to like parts throughout the various embodiments.

Those skilled in the art will appreciate that in the disclosure of the present disclosure, orientation or positional relationships indicated by the terms "longitudinal", "transverse", "upper", "lower", "front", "rear", "left", "right", "vertical", "horizontal", "top", "bottom", "inner", "outer", etc. are based on the orientation or positional relationships shown in the drawings, which are merely intended to facilitate describing the present disclosure and to simplify the description rather than indicating or implying that the referenced system or element must have a particular orientation and be constructed and operated in a particular orientation. Therefore, the above terms are not to be construed as limiting the present disclosure.

In the descriptions of this specification, the description with reference to the terms "one implementation", "some implementations", "schematic implementations", "example", "specific example", or "some examples", etc. means that particular features, structures, materials, or characteristics described in conjunction with the implementation or example are included in at least one implementation or example of the present disclosure. In this specification, schematic representations of the above terms do not necessarily refer to the same implementation or example. Furthermore, the particular features, structures, materials, or characteristics described may be combined in any suitable manner in any one or more implementations or examples.

Finally, it is to be noted that the above embodiments are merely illustrative of the technical solutions of the present disclosure and are not intended to be limiting thereof. Although the present disclosure has been described in detail with reference to the foregoing embodiments, those of ordinary skill in the art will appreciate that the technical solutions of the foregoing embodiments may still be modified, or some or all of the technical features thereof may be equivalently replaced. These modifications or replacements do not make the essence of the corresponding technical solutions depart from the scope of the technical solutions of the various embodiments of the present disclosure.

The invention claimed is:

1. A chip, comprising:
    a base, wherein a through hole penetrating through the base is provided in the base, and a conductive column is provided in the through hole;
    a first surface of the base is provided with a first annular groove which surrounds the conductive column; and
    a first isolator is provided in the first annular groove, and a first air gap extending along a circumferential direction of the first annular groove is formed in the first isolator, wherein
    the first air gap surrounds the conductive column for one circle; and, wherein
    the first surface of the base is further provided with a second annular groove and a third annular groove;
    the second annular groove is sleeved outside the first annular groove, and a second isolator is filled in the second annular groove;
    the third annular groove is sleeved outside the second annular groove, and a third isolator is filled in the third annular groove; and
    a width of the first annular groove is greater than width of the second annular groove and width of the third annular groove along a radial direction of the through hole, and the second annular groove and the third annular groove are consistent in width.

2. The chip of claim 1, wherein
    when taking a plane perpendicular to a center line of the through hole as a cross section, the cross section of the first annular groove is in the shape of a regular polygon with eight or more sides.

3. The chip of claim 2, wherein
    the regular polygon has an inscribed circle diameter of 5 µm to 40 µm.

4. The chip of claim 1, wherein
    the first annular groove has a depth of 0.2 µm to 2 µm in a direction of a center line of the through hole.

5. The chip of claim 1, wherein
    a center line of the first annular groove coincides with a center line of the through hole.

6. The chip of claim 1, wherein
    when taking a plane perpendicular to the first surface of the base and comprising a center line of the through hole as a cross section, the cross section of the first air gap is in the shape of a triangle, a rectangle, a circle, or an ellipse.

7. The chip of claim 1, wherein
    a second air gap extending along a circumferential direction of the second annular groove is formed in the second isolator; and/or
    a third air gap extending along a circumferential direction of the third annular groove is formed in the third isolator.

8. A memory, comprising:
    at least two stacked chips, wherein conductive columns in adjacent chips abut with each other, each chip comprises: a base, wherein a through hole penetrating through the base is provided in the base, and a conductive column is provided in the through hole;
    a first surface of the base is provided with a first annular groove which surrounds the conductive column; and
    a first isolator is provided in the first annular groove, and a first air gap extending along a circumferential direction of the first annular groove is formed in the first isolator, wherein
    the first air gap surrounds the conductive column for one circle; and, wherein
    the first surface of the base is further provided with a second annular groove and a third annular groove;
    the second annular groove is sleeved outside the first annular groove, and a second isolator is filled in the second annular groove;
    the third annular groove is sleeved outside the second annular groove, and a third isolator is filled in the third annular groove; and
    a width of the first annular groove is greater than width of the second annular groove and width of the third annular groove along a radial direction of the through hole, and the second annular groove and the third annular groove are consistent in width.

9. The memory of claim 8, wherein
    when taking a plane perpendicular to a center line of the through hole as a cross section, the cross section of the first annular groove is in the shape of a regular polygon with eight or more sides.

10. The memory of claim 9, wherein
    the regular polygon has an inscribed circle diameter of 5 µm to 40 µm.

11. The memory of claim 8, wherein
    the first annular groove has a depth of 0.2 µm to 2 µm in a direction of a center line of the through hole.

12. The memory of claim 8, wherein
    a center line of the first annular groove coincides with a center line of the through hole.

13. The memory of claim 8, wherein
    when taking a plane perpendicular to the first surface of the base and comprising a center line of the through hole as a cross section, the cross section of the first air gap is in the shape of a triangle, a rectangle, a circle, or an ellipse.

14. The memory of claim 8, wherein
    a second air gap extending along a circumferential direction of the second annular groove is formed in the second isolator; and/or a third air gap extending along a circumferential direction of the third annular groove is formed in the third isolator.

\* \* \* \* \*